US011830825B2

(12) United States Patent
Chen

(10) Patent No.: US 11,830,825 B2
(45) Date of Patent: Nov. 28, 2023

(54) ADVANCED SEAL RING STRUCTURE AND METHOD OF MAKING THE SAME

(71) Applicant: Taiwan Semiconductor Manufacturing Co., Ltd., Hsinchu (TW)

(72) Inventor: Hsien-Wei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/833,120

(22) Filed: Jun. 6, 2022

(65) Prior Publication Data
US 2022/0302047 A1 Sep. 22, 2022

Related U.S. Application Data

(63) Continuation of application No. 17/160,571, filed on Jan. 28, 2021, now Pat. No. 11,373,962.

(60) Provisional application No. 63/072,499, filed on Aug. 31, 2020, provisional application No. 63/065,586, filed on Aug. 14, 2020.

(51) Int. Cl.
H01L 23/00 (2006.01)
H01L 23/532 (2006.01)
H01L 23/58 (2006.01)

(52) U.S. Cl.
CPC ...... *H01L 23/562* (2013.01); *H01L 23/53209* (2013.01); *H01L 23/585* (2013.01)

(58) Field of Classification Search
CPC ............. H01L 23/562; H01L 23/53209; H01L 23/585
See application file for complete search history.

(56) References Cited

U.S. PATENT DOCUMENTS

| 6,424,051 | B1 * | 7/2002 | Shinogi | H01L 23/3185 |
| | | | | 257/E23.002 |
| 7,235,864 | B2 | 6/2007 | Lee | |
| 8,253,217 | B2 | 8/2012 | Chen et al. | |
| 8,334,582 | B2 | 12/2012 | Jeng et al. | |
| 8,395,239 | B2 | 3/2013 | Chen et al. | |
| 8,461,021 | B2 | 6/2013 | Yaung et al. | |
| 8,530,997 | B1 | 9/2013 | Yang et al. | |
| 9,093,308 | B2 | 7/2015 | Yang et al. | |
| 9,245,842 | B2 | 1/2016 | Chen et al. | |
| 9,437,739 | B2 | 9/2016 | Yu et al. | |

(Continued)

FOREIGN PATENT DOCUMENTS

| KR | 20080025305 A | 3/2008 |
| KR | 20090004469 A | 1/2009 |

(Continued)

*Primary Examiner* — Peniel M Gumedzoe
(74) *Attorney, Agent, or Firm* — HAYNES AND BOONE, LLP

(57) ABSTRACT

A semiconductor structure includes a substrate having a seal ring region and a circuit region, a dielectric interlayer over the substrate, one or more dielectric layers disposed over the dielectric interlayer, a connection structure disposed in the one or more dielectric layers in the seal ring region, and a metal plug disposed below the connection structure and disposed at least partially in the dielectric interlayer in the seal ring region. The connection structure includes a stack of metal layers and metal vias connecting the stack of metal layers.

20 Claims, 13 Drawing Sheets

(56) References Cited

U.S. PATENT DOCUMENTS

| | | | |
|---|---|---|---|
| 10,229,889 B2 | 3/2019 | Tatour et al. | |
| 10,366,956 B2 | 7/2019 | Yang et al. | |
| 10,373,865 B2 | 8/2019 | Yang et al. | |
| 2003/0160261 A1 | 8/2003 | Moriya | |
| 2004/0150070 A1 | 8/2004 | Okada | |
| 2005/0098893 A1 | 5/2005 | Tsutsue | |
| 2011/0309465 A1* | 12/2011 | Chen | H01L 23/585 |
| | | | 257/503 |
| 2014/0327115 A1 | 11/2014 | Vu et al. | |
| 2018/0122751 A1 | 5/2018 | Chen et al. | |

FOREIGN PATENT DOCUMENTS

| | | |
|---|---|---|
| KR | 20090094204 A | 9/2009 |
| KR | 20150137967 A | 12/2015 |
| TW | 201740513 A | 11/2017 |
| TW | I612623 B | 1/2018 |

* cited by examiner

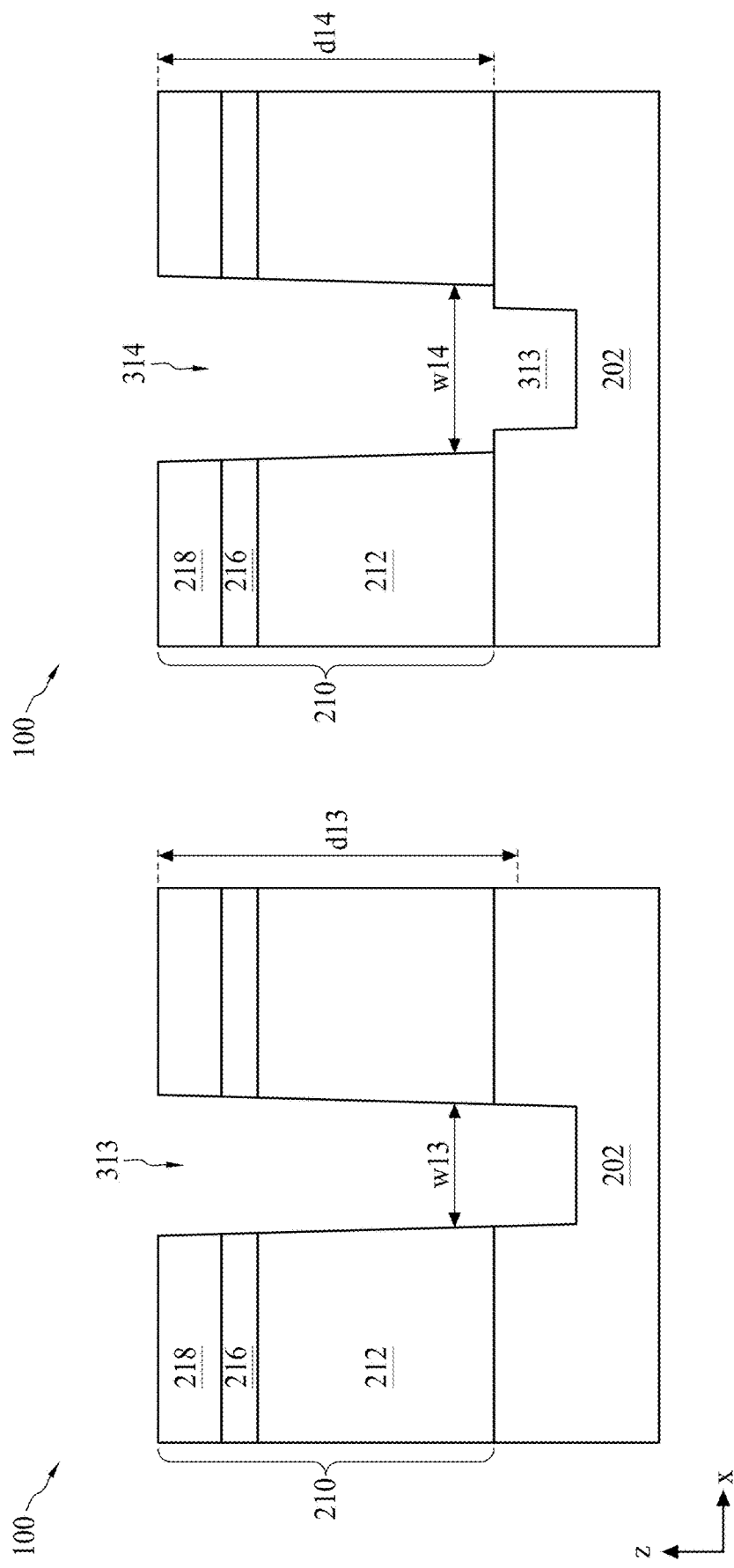

ADVANCED SEAL RING STRUCTURE AND METHOD OF MAKING THE SAME

PRIORITY

This is a continuation application of U.S. patent application Ser. No. 17/160,571, filed Jan. 28, 2021, which claims the benefit to U.S. Provisional Application Ser. No. 63/072,499 filed Aug. 31, 2020 and U.S. Provisional Application Ser. No. 63/065,586 filed Aug. 14, 2020, the entire disclosures of which are incorporated herein by reference.

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each IC die. This seal ring is formed during fabrication of the many layers that comprise the circuits, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, due to the shrinkage of circuits' critical dimension and metal routing density, there is an increased demand for better adhesion between substrate and metal features (such as metal contacts and metal interconnects) and between metal features and dielectric materials for both the circuits and the seal rings. Quality of metal filling is also a critical factor to impact functionality of seal rings. Poor metal filling, such as poor adhesion, seam, or void would impair the designed function of seal rings and cause delamination defects or cracks. Improvements in these areas as well as other improvements of seal rings are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 13, 14, 15, and 16 are cross-sectional views of a semiconductor device in a seal ring region, during fabrication processes according to the method in FIG. 12 according to an embodiment.

DETAILED DESCRIPTION

Figure 1:
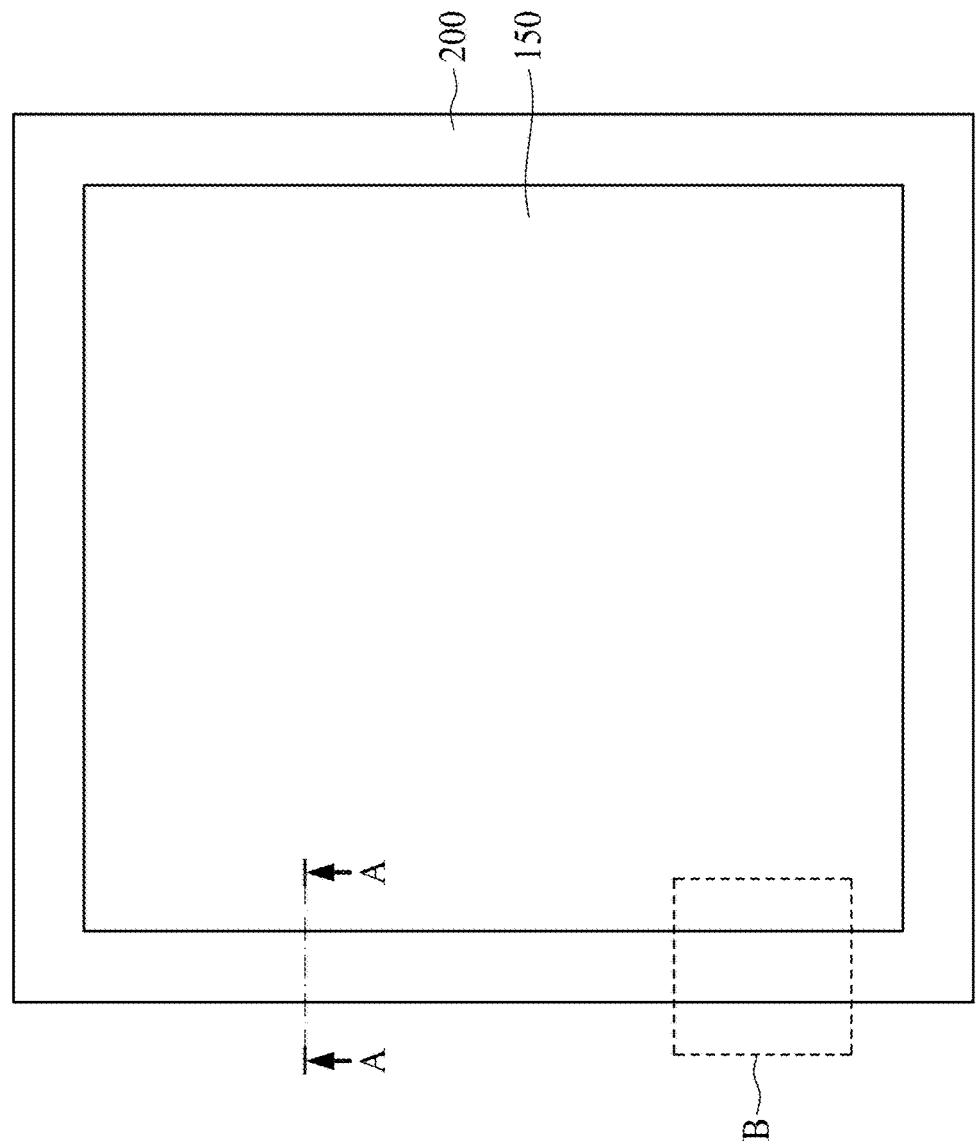
FIG. 1 is a top plan view of an integrated circuit die with a seal ring structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor seal ring structures. In an embodiment of the present disclosure, a seal ring structure includes a connection structure and a plurality of metal plugs disposed between a substrate and the connection structure where each metal plug has a multi-step profile. The multi-step profile improves the filling of conductive materials that constitute the metal plugs and improves the adhesion between the metal plugs and the substrate, thereby improving the ability of the seal ring to withstand stress during dicing and improving the seal ring's operational reliability. Each metal plug may be formed into a ring or ring-like structure or multiple segments of a ring or ring-like structure. Each metal plug may be electrically connected to the connection structure using one or more via bars (long vias) or a series of small vias (round vias). In an embodiment, the seal ring structure further includes a plurality of dummy gates. The metal plugs and the dummy gates are alternately arranged to form a plurality of metal plug rings and a plurality of dummy gate rings. Forming the metal plugs and the dummy gates in such alternating manner substantially reduces or eliminates dishing in the seal ring region during chemical mechanical planarization (CMP) processing. In some embodiments, such metal plugs and dummy gates are also formed in an assembly isolation region that is disposed between a seal ring region and a circuit region. Having the metal plugs and the dummy gates in the assembly isolation region balances the topography loading during various processes, including CMP. In some embodiments, multiple (such as four) seal rings are formed in the seal ring region to further improve the seal ring structure's operational reliability. Those of ordinary skill in the art should appreciate that they may readily use the present disclosure as a basis for designing or modifying other processes and structures for carrying out the same purposes and/or achieving the same advantages of the embodiments introduced herein.

Figure 2:
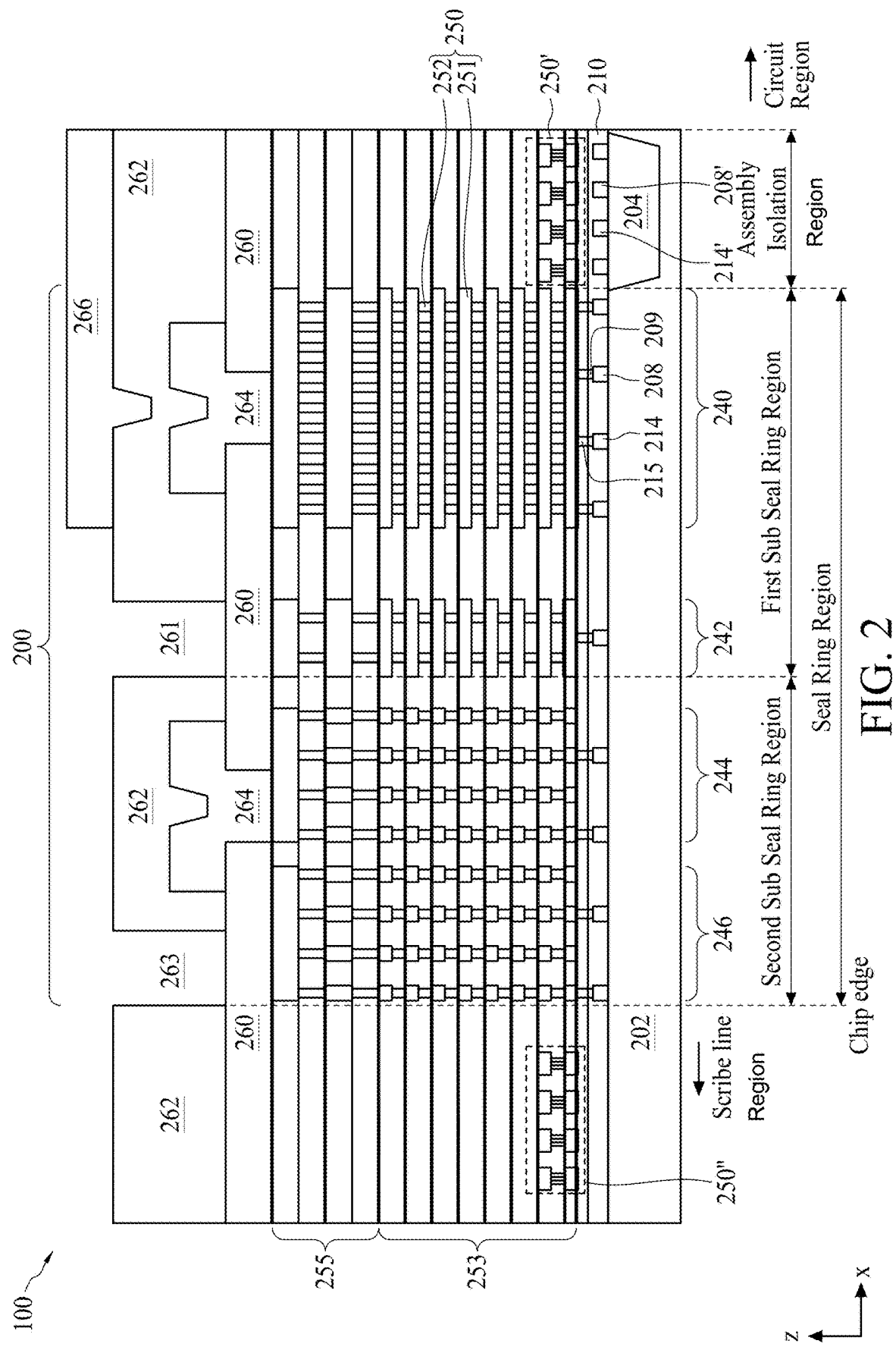
FIG. 2 is a cross-sectional view of an embodiment of a semiconductor device including a seal ring region, along the "A-A" line of FIG. 1, according to various aspects of the present disclosure.

Referring now to FIG. 1, a top plan view is illustrated of a semiconductor structure (or semiconductor device) 100 including one or more circuit elements 150 (such as transistors, resistors, capacitors, memories, etc.) surrounded by a seal ring structure 200. FIG. 2 illustrates a cross-sectional view of an embodiment of the semiconductor structure 100 along the A-A line in FIG. 1, and FIGS. 3, 7, 8, 9, 10, and 11 illustrate magnified top plan views of a portion B of the semiconductor structure 100 according to various embodiments.

Referring to FIG. 2, the semiconductor structure 100 includes a substrate 202. The substrate 202 is a silicon substrate in the present embodiment. The substrate 202 may alternatively include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. The substrate 202 may include doped active regions such as a P-well and/or an N-well. The substrate 202 may also further include other features such as a buried layer, and/or an epitaxy layer. Furthermore, the substrate 202 may be a semiconductor on insulator such as silicon on insulator (SOI). In other embodiments, the semiconductor substrate 202 may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a multilayer compound semiconductor structure. The active region may be configured as an NMOS device (e.g., nFET) or a PMOS device (e.g., pFET). The substrate 202 may include underlying layers, devices, junctions, and other features (not shown).

The substrate 202 includes a seal ring region, over which the seal ring structure 200 is formed. The substrate 202 further includes a circuit region, over which the circuit elements 150 are formed. The substrate 202 further includes an assembly isolation region between the seal ring region and the circuit region and a scribe line region surrounding the seal ring region. During dicing, the semiconductor structure 100 is cut (for example, using a dicing saw or a laser) along the scribe line region, thereby forming a device or semiconductor chip (or an IC die) having the circuit elements 150 surrounded by the assembly isolation region and the seal ring structure 200.

The seal ring region further includes two sub seal ring regions, a first sub seal ring region and a second sub seal ring region. The first sub seal ring region is between the second sub seal ring region and the assembly isolation region. The first sub seal ring region is wider than the second sub seal ring region in the present embodiment. For example, the second sub seal ring region may be about 70% to 90% as wide as the first sub seal ring region. The second sub seal ring region is wider than the assembly isolation region. For example, the assembly isolation region may be about 70% to 90% as wide as the second sub seal ring region. In some embodiments, the width of the assembly isolation region may be in a range of about 5 microns to about 6 microns, the width of the first sub seal ring region may be in a range of about 8 microns to about 10 microns, and the width of the second sub seal ring region may be in a range of about 6 microns to about 8 microns.

Seal rings 240 and 242 are formed in the first sub seal ring region. Seal rings 244 and 246 are formed in the second sub seal ring region. The seal ring structure 200 includes the seal rings 240, 242, 244, and 246. The seal ring 240 is wider than the seal rings 242, 244, and 246, thus may be referred to as the main seal ring. Seal rings 244 and 246 have about the same width. Seal ring 242 is narrower than the seal rings 240, 244, and 246. Having multiple nested seal rings ensures that at least the inner seal ring(s) is/are protected from cracks during dicing (e.g., die sawing). For example, the seal rings 246, 244 in the second sub seal ring region protect the seal rings 242, 240 in the first sub seal ring region from damages that may occur during dicing.

Each of the seal rings 240, 242, 244, and 246 includes one or more metal plugs 214 disposed on the substrate 202. Even though not shown in FIG. 2, the substrate 202 includes active regions (such as $N^+$ or $P^+$ doped regions) over which the one or more metal plugs 214 are disposed. In the present embodiment, each metal plug 214 is formed into a multi-step profile with multiple sections that become wider as the height of the metal plug 214 increases. Having the multi-step profile improves the metal filling of the metal plugs 214 and eliminates seams and/or void in the metal plugs 214. This greatly enhances the mechanical connection between the seal ring structure 200 and the substrate 202. The aspects of the metal plugs 214 will be further described in later sections of the present disclosure.

Each of the seal rings 240, 242, 244, and 246 includes a connection structure 250 that includes multiple metal layers 251 stacked one over another and vertically connected by metal vias 252. Metal layers 251 and metal vias 252 may comprise copper, copper alloys, or other conductive materials and may be formed using damascene or dual damascene processes. Each of the metal layers 251 and the metal vias 252 may include a conductive barrier layer (such as TiN or TaN) surrounding a metal core (such as copper). Each of the seal rings 240, 242, 244, and 246 further includes metal vias 215 that connect the metal plugs 214 to the connection structure 250. In an embodiment, the vias 215 include tungsten. In alternative embodiments, the vias 215 include tungsten, cobalt, titanium, tantalum, ruthenium, or a combination thereof. In an embodiment, each of the metal layers 251 is formed into a ring or a ring-like structure (such as a substantially square ring) that surrounds the circuit region. In other words, each of the metal layers 251 is formed into a closed structure and extends along the edges of the area occupied by the circuit elements 150. In the present embodiment, a ring or a ring-like structure refers to a closed structure, which may be rectangular, square, substantially rectangular, substantially square, or in other polygonal shapes. In an embodiment, the outer vias 252 (the vias 252 that are closest and the furthest, respectively, from the circuit region in each connection structure 250) are formed into the shape of a ring surrounding the circuit region. Thus, they are also referred to as via bars. The inner vias 252 are formed into discrete vias that form a line parallel to the outer vias 252. In the present embodiment, each of the seal rings 240 and 244 (main seal rings) further includes an aluminum pad 264 disposed on the connection structure 250.

In the present embodiment, the seal rings 240, 244, and 246 further include dummy gates 208 and dummy gate vias 209 that connect the dummy gates 208 to the connection structures 250. The device 100 further includes an interlayer 210 over the substrate 202 and extends across the circuit region, the assembly isolation region, the seal ring region, and the scribe line region. In the assembly isolation region, the device 100 includes a plurality of metal plugs 214' and a plurality of dummy gates 208' that are disposed on an isolation structure (such as shallow trench isolation) 204. The isolation structure 204 may include silicon oxide, silicon nitride, silicon oxynitride, other suitable isolation material (for example, including silicon, oxygen, nitrogen, carbon, or other suitable isolation constituent), or combinations thereof. Isolation structure 204 can include different structures, such as shallow trench isolation (STI) structures and/or deep trench isolation (DTI) structures. In some embodiments, the device 100 may include a connection structure 250' (for example, having various dummy lines and dummy vias) in the assembly isolation region. A portion of the connection structure 250' is shown in FIG. 2. In some embodiments, the device 100 may include a connection structure 250" (for example, having various dummy lines and dummy vias) in the scribe line region. A portion of the connection structure 250" is shown in FIG. 2. The metal plugs 214, 214' and the dummy gates 208 and 208' are disposed at least partially in the interlayer 210. Having the plurality of dummy gates 208, 208' in the seal ring region and in the assembly isolation region substantially reduces or eliminates dishing in the seal ring region during CMP processing of the device 200. The dummy gates 208, 208' may be formed by depositing various material layers and etching/patterning the various material layers to form gate structures. Each dummy gate 208, 208' may include a dummy gate dielectric layer (such as a layer having silicon dioxide, silicon oxynitride, a high-k dielectric layer, and/or other materials) and a dummy gate electrode layer (such as a layer having polysilicon or a metallic material). The dummy gates 208, 208' may be formed using a gate first process or a gate last process. The interlayer 210 may include one or more dielectric materials such as silicon oxide, silicon nitride, or other suitable materials. The interlayer 210 may be deposited using CVD, ALD, or other suitable processes.

The device 100 further includes a stack of dielectric layers 253 over the interlayer 210 and a stack of dielectric layers 255 over the dielectric layers 253. The connection structures 250 are disposed within the dielectric layers 253, 255. In an embodiment, the dielectric layers 253 are formed of a low-k dielectric material. For example, the dielectric constants (k values) of the dielectric layers 253 may be lower than 3.0, and even lower than about 2.5, hence may be referred to as extreme low-k (ELK) dielectric layers 253. In an embodiment, the dielectric layers 253 include silicon oxide, silicon nitride, silicon oxynitride, TEOS formed oxide, PSG, BPSG, low-k dielectric material, other suitable dielectric material, or combinations thereof. In an embodiment, the dielectric layers 255 may be formed of un-doped silicate glass (USG) in order to improve the mechanical property and prevent moisture penetration.

The device 100 further includes a passivation layer 260 over the dielectric layers 255 and another passivation layer 262 over the passivation layer 260. Each of the aluminum pads 264 includes a top portion that is disposed over the passivation layer 260 and a bottom portion that penetrates the passivation layer 260 and electrically connects to the connection structure 250. In an example, the top portion of each aluminum pad 264 may have a width about 3 microns to about 4 microns, and the bottom portion of each aluminum pad 264 may have a width about 1.5 microns to about 2 microns. In an embodiment, each of the aluminum pads 264 is formed into a shape of a ring that surrounds the circuit region. Thus, the aluminum pads 264 may also be referred to as aluminum rings 264. Aluminum pads 264 may be formed simultaneously with the formation of bond pads (not shown) that are exposed on the top surface of IC die. The passivation layer 262 is disposed over the passivation layer 260 and the aluminum pads 264. Passivation layers 260 and 262 may be formed of oxides, nitrides, and combinations thereof, and may be formed of the same or different materials.

A trench 261 is provided in the passivation layer 262 between the first and the second sub seal ring regions. Another trench 263 is provided in the passivation layer 262 between the scribe line region and the second sub seal ring region. In an embodiment, each of the trenches 261 and 263 is formed into a shape of a ring surrounding the circuit region. An advantageous feature of the dual trenches 261, 263 is that if a crack occurs in the scribe line region during dicing, the crack will be stopped by the trench 263. Even if the crack propagates across the trench 263, if at all, the stress of the crack is substantially reduced by the trench 261, and the seal ring 242 will effectively prevent any further propagation of the crack and protects the main seal ring 240 from damages. In an embodiment, each of the trenches 261, 263 is designed to have a width about 1.5 microns to about 2 microns to effectuate the crack prevention function discussed above yet leaving enough passivation layer 262 to cover and protect the aluminum pads 264. The nested seal rings 246, 244, 242, 240 and the dual trenches 263, 261 jointly ensure the operational reliability of the seal ring structure 200. In the present embodiment, the device 100 further includes a layer 266 that is disposed over the passivation layer 262 and extends in the assembly isolation region and the first sub seal ring region. In an embodiment, the layer 266 includes a material such as organic polyimide and provides stress buffer for protecting the circuit die after package assembly. The layer 266 is optional and can be omitted from the device 100 in an alternative embodiment.

Figure 3:
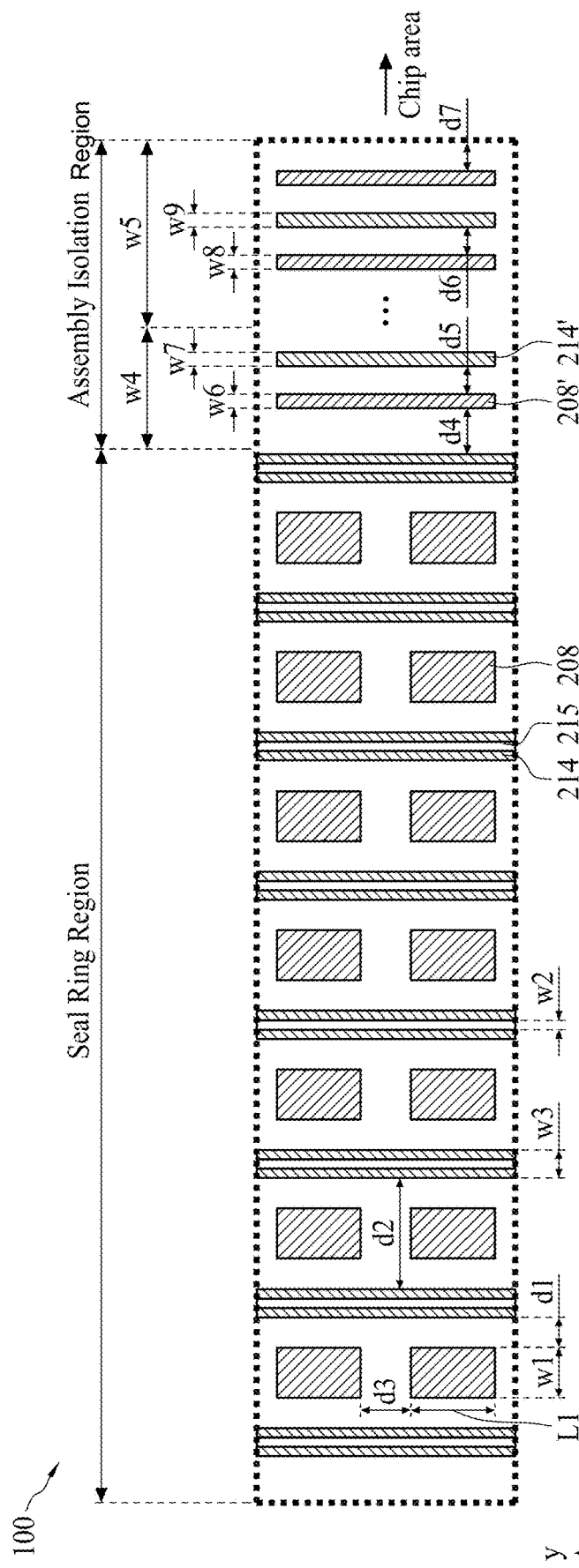
FIG. 3 is a top plan view of an embodiment of a semiconductor device, in the "B" region of FIG. 1, according to various aspects of the present disclosure.
Figure 5:
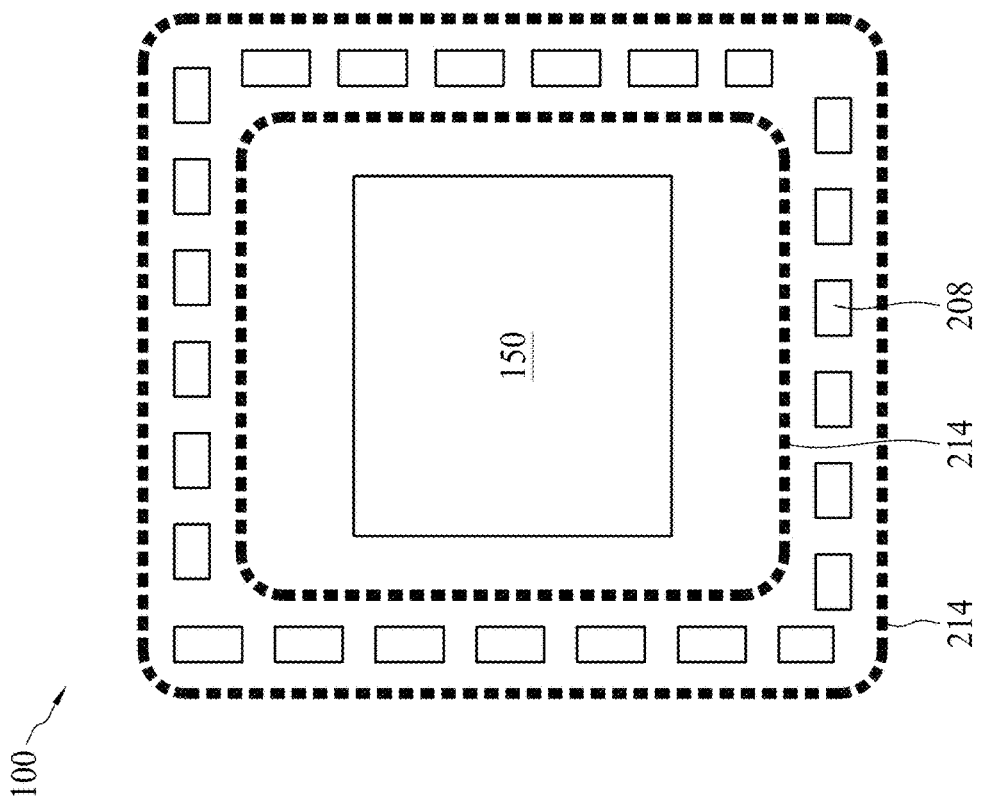
FIGS. 4 and 5 are top plan views of an integrated circuit die with a seal ring structure according to aspects of the present disclosure.
Figure 4:
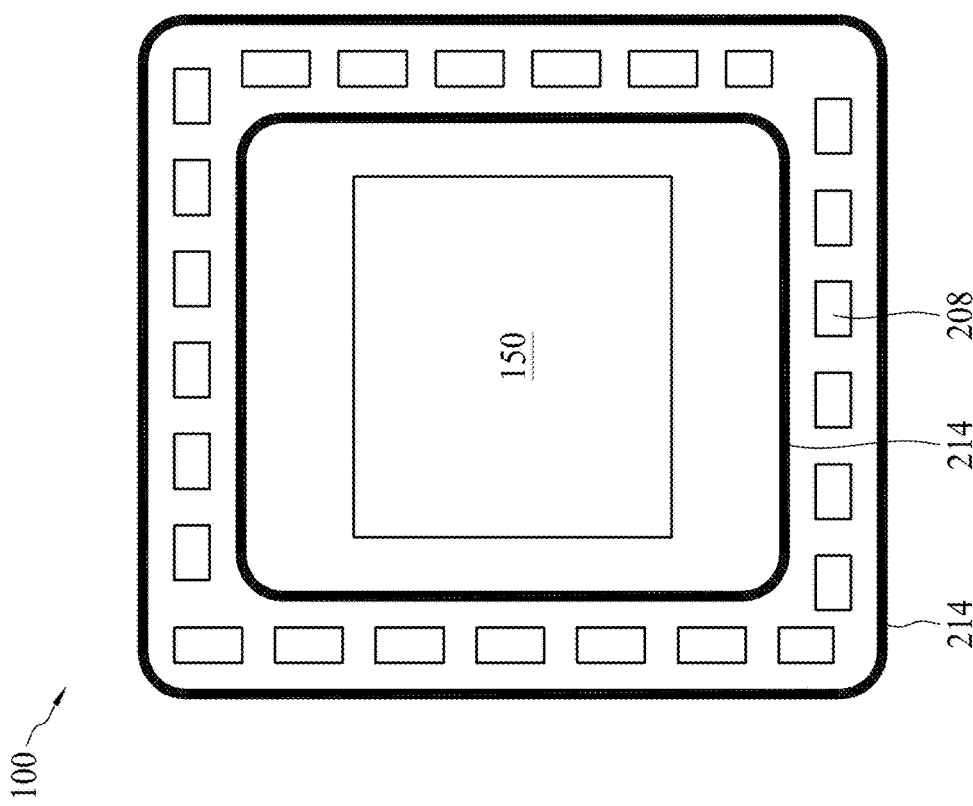

FIG. 3 illustrates a top plan view of the device 100 in the seal ring region and in the assembly isolation region, in portion, in the region "B" of FIG. 1 according to an embodiment. Referring to FIG. 3, in the illustrated embodiment, each metal plug 214 is formed into a rectangular structure from the top view. In an embodiment, each metal plug 214 is formed as a continuous and closed structure (i.e., a ring) that surrounds the area occupied by the circuit elements 150, such as shown in FIG. 4. In such embodiment, the metal plug 214 is also referred to as a continuous metal ring 214 (or simply a metal ring 214). In another embodiment, each metal plug 214 is formed as an elongated segment and a line of metal plugs 214 extend along the edges of the area occupied by the circuit elements 150 and form a segmented ring, such as shown in FIG. 5. In such embodiments, the line of metal plugs 214 are also referred to as a segmented metal ring 214. In the embodiments shown in FIGS. 3, 4, and 5, the dummy gates 208 are formed as rectangular structures and are disposed between two metal rings 214 (FIG. 4) or two segmented metal rings 214 (FIG. 5) and are distributed substantially evenly along the edges of the area occupied by the circuit elements 150. For simplicity, FIG. 4 illustrates two metal rings 214 with dummy gates 208 therebetween and omits other metal rings and other dummy gates. Similarly, FIG. 5 illustrates two segmented metal rings 214 with dummy gates 208 therebetween and omits other metal rings and other dummy gates. In the embodiment illustrated in FIG. 3, the metal vias 215 are formed into the same shape (from the top view) as the metal plugs 214 that the metal vias 215 are disposed on. In other words, when the metal plug 214 is a continuous metal ring, the metal via 215 disposed thereon is also a continuous metal ring, and when the metal plug 214 is a segment of a segmented metal ring, the metal via 215 disposed thereon is also a segment of a segmented metal ring. The metal vias 215 in FIG. 3 are also referred to as via bars 215 (i.e., bar shaped). In the assembly isolation region, the metal plugs 214' and the dummy gates 208' are formed into elongated segments. They may be distributed substantially evenly along the edges of the area occupied by the circuit elements 150, such as the distribution of the dummy gates 208 in FIGS. 4 and 5. In the embodiment illustrated in FIG. 3, the device 100 does not include vias disposed on the dummy gates 208, 208' and the metal plugs 214'. In other words, the dummy gates 208, 208' and the metal plugs 214' are isolated from the connection structures directly above. In such embodiment, the dummy gates 208, 208' and the metal plugs 214' are designed to provide good pattern density and good topography for forming the metal plugs 214.

In the embodiment illustrated in FIG. 3, The metal plugs 214 and the dummy gates 208 are arranged in an alternating manner along the "x" direction in the seal ring region. Each metal plug 214 has a width w3, each dummy gate 208 has a width w1, each metal via 215 has a width w2, the distance between an edge of the dummy gate 208 and an adjacent edge of the metal plug 214 is d1, the distance between two edges of adjacent metal plugs 214 is d2. The dimensions w1, w2, w3, d1, and d2 are measured along the "x" direction. Further, each dummy gate 208 has a length L1, and two adjacent dummy gates 208 are spaced by a distance d3, both along the "y" direction. In an embodiment, the width w1 is about twice of the width w3. In an example, the width w1 may be in a range of 180 nm to about 220 nm, and the width w3 may be in a range of 90 nm to about 110 nm. The distance d1 may be about the same as the width w3. The distance d3 may be about the same as the width w1. The length L1 may be about 3 times of the width w1. Further, the width w2 may be about 30% to about 45% of the width w3. In the assembly isolation region, the dummy gates 208' and the metal plugs 214' are also arranged in an alternating manner along the "x" direction. In a first region labeled as having a width w4, each dummy gate 208' has a width w6, each metal plug 214' has a width w7, each dummy gate 208' and the adjacent metal plug 214' is spaced by a distance d5, and the dummy gate 208' is spaced from the nearest metal plug 214 in the seal ring region by a distance d4. In an embodiment, the distance d4 may be in a range of about 250 nm to about 300 nm. In a second region labeled as having a width w5, each dummy gate 208' has a width w8, each metal plug 214' has a width w9, each dummy gate 208' and the adjacent metal plug 214' is spaced by a distance d6, and the dummy gate 208' is spaced from the circuit region by a distance d7. In an embodiment, the distance d7 may be in a range of about 250 nm to about 300 nm. In an embodiment, the width w4 is greater than the width w5, but the features in the second region (w5) are wider and spaced from each other further than the features in the first region (w4). For example, the width w4 may be in a range of about 3 microns to about 4 microns, the width w5 may be in a range of about 1.8 microns to about 2.2 microns, the width w6 may be in a range of about 5 nm to 8 nm, the width w7 is about 15 nm to about 25 nm, the distance d5 is about 10 nm to 16 nm, the width w8 is about 32 nm to 40 nm, the width w9 is about 25 nm to about 35 nm, and the distance d6 is about 20 nm to about 30 nm.

Figure 6:
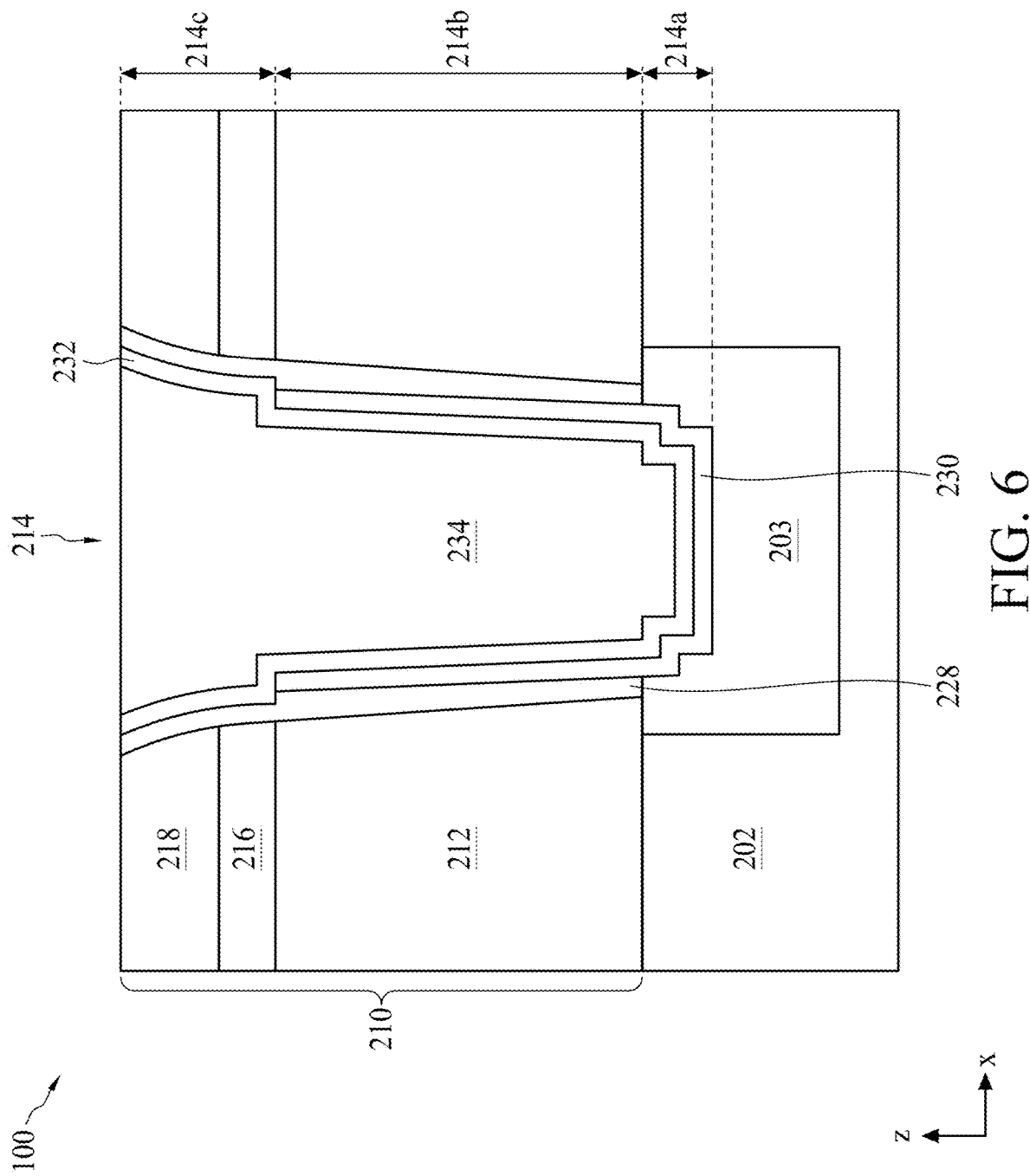
FIG. 6 is a cross-sectional view of an embodiment of a semiconductor device in a seal ring region, according to various aspects of the present disclosure.

FIG. 6 illustrates a cross-sectional view of the metal plug 214 according to an embodiment of the present disclosure. Referring to FIG. 6, the metal plug 214 is disposed in a trench where the bottom of the trench is a silicide layer 203 and sidewalls of the trench are formed of a dielectric layer 228. The silicide layer 203 is formed over the substrate 202. In an embodiment, the silicide layer 203 is formed over a $P^+$ or $N^+$ doped region of the substrate 202. The interlayer 210 (having dielectric layers 212, 216, and 218) is provided over the substrate 202 and over outer sidewalls of the dielectric layer 228. The silicide layer 203 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the dielectric layer 212 includes silicon oxide, the dielectric layer 216 includes silicon nitride, the dielectric layer 218 includes silicon oxide such as plasma enhanced oxide (PEOX), and the dielectric layer 228 includes silicon carbonitride (SiCN). The dielectric layers 212, 216, 218, and 228 may include other dielectric materials in alternative embodiments.

The metal plug 214 includes a conductive adhesion promoter 230, a conductive barrier layer 232 over the conductive adhesion promoter 230, and a metal core (or metal fill layer) 234 over the conductive barrier layer 232 and filling in the remaining space of the trench. The conductive barrier layer 232 functions to prevent metal materials of the metal core 234 from diffusing into the dielectric layers adjacent the metal plug 214. The conductive barrier layer 232 may include titanium (Ti), tantalum (Ta), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. In an embodiment, the conductive adhesion promoter 230 includes chromium, molybdenum, or other suitable material. In some embodiments, the conductive adhesion promoter 230 is omitted in the metal plug 214. The metal core 234 may include tungsten (W), cobalt (Co), molybdenum (Mo), ruthenium (Ru), or other metals, and may be formed by CVD, PVD, ALD, plating, or other suitable processes. In the depicted embodiment, the metal plug 214 includes three sections 214a, 214b, and 214c. The section 214b is wider than the section 214a, and the section 214c is wider than the section 214b. This results in a first step transitioning from the section 214a to the section 214b and a second step transitioning from the section 214b to the section 214c. The metal plug 214 may include more than two steps in alternative embodiments. Having such multi-step profile improves the metal filling quality of the metal plug 214 and increases the adhesion between the metal plug 214 and the substrate 202 and the interlayer 210. In the depicted embodiment, the conductive adhesion promoter 230 extends along the sidewalls of the lower sections 214a and 214b, but not the upper section 214c. In other words, the section 214c is disposed above the conductive adhesion promoter 230. In an alternative embodiment, the conductive adhesion promoter 230 extends along the sidewalls of all three sections 214a, 214b, and 214c. In an embodiment, the metal plug 214' is constructed in the same way as the metal plug 214.

Figure 7:
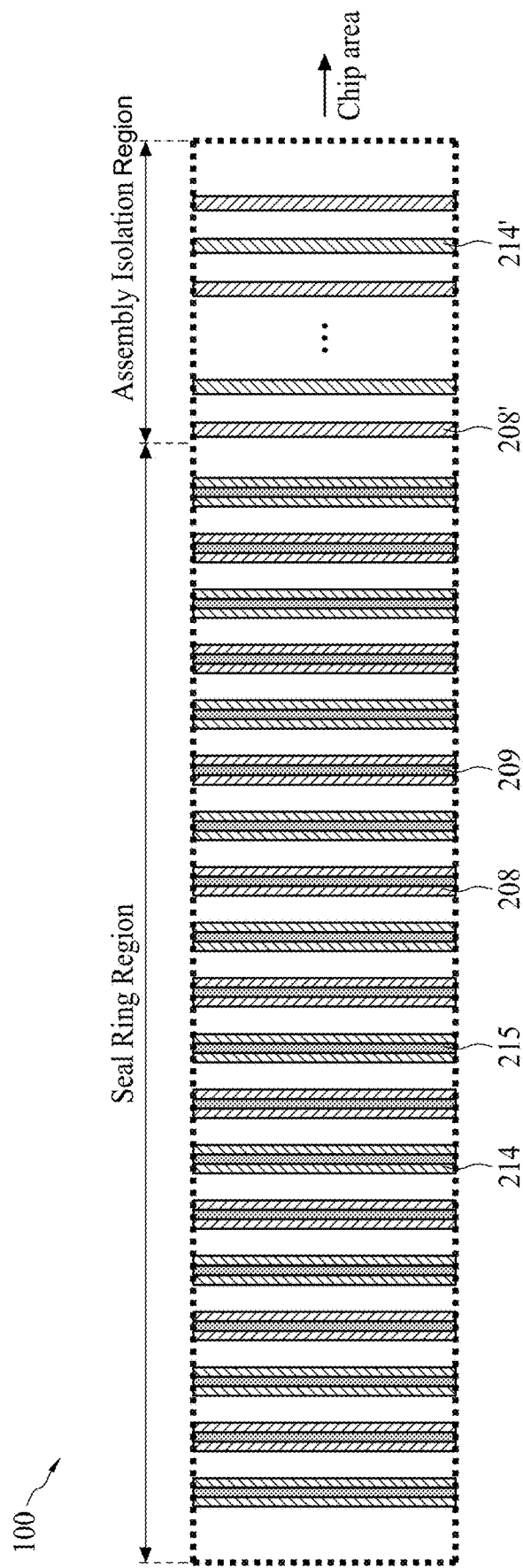
FIGS. 7, 8, 9, 10, and 11 are top plan views of various embodiments of a semiconductor device, in the "B" region of FIG. 1, according to various aspects of the present disclosure.

FIG. 7 illustrates a top plan view of the device 100 in the seal ring region and in the assembly isolation region, in portion, in the region "B" of FIG. 1 according to an alternative embodiment. The metal plugs 214 and 214', the metal vias 215, and the dummy gates 208' of this embodiment are configured similar to or substantially the same as the embodiment shown in FIG. 3. Unlike the embodiment shown in FIG. 3, the dummy gates 208 in this embodiment are formed into rings or segmented rings. The dummy gates 208 are formed with dimensions (widths and lengths) similar to the metal plugs 214. Further, the device 100 includes the vias 209 disposed over the dummy gates 208 and connecting the dummy gates 208 to the connection structure 250 (see FIG. 2). In an embodiment, the vias 209 are formed into the same shape and include the same material as the metal vias 215 (both are via bars). The dummy gates 208 and the metal plugs 214 are substantially evenly distributed in the seal ring region. In this embodiment, the device 100 does not include vias disposed over the dummy gates 208' and the metal plugs 214'.

Figure 8:
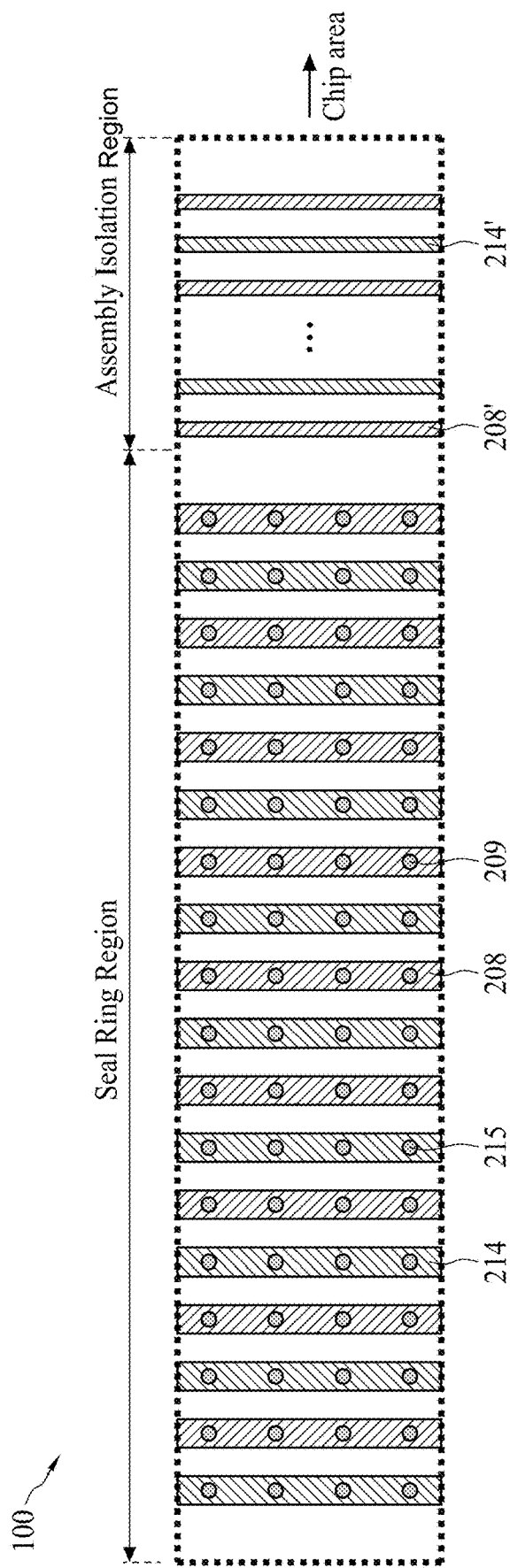

FIG. 8 illustrates a top plan view of the device 100 in the seal ring region and in the assembly isolation region, in portion, in the region "B" of FIG. 1 according to an alternative embodiment. The metal plugs 214 and 214', and the dummy gates 208 and 208' of this embodiment are configured similar to or substantially the same as the embodiment shown in FIG. 7. Unlike the embodiment shown in FIG. 7, the vias 215 and 209 are formed as discrete round vias. In an embodiment, the round vias 215 and 209 each has a diameter in a range about 20 nm to about 50 nm. The round vias 215 and 209 are distributed substantially evenly along the metal plugs 214 and the dummy gates 208, respectively. In this embodiment, the device 100 does not include vias disposed over the dummy gates 208' and the metal plugs 214'.

Figure 9:
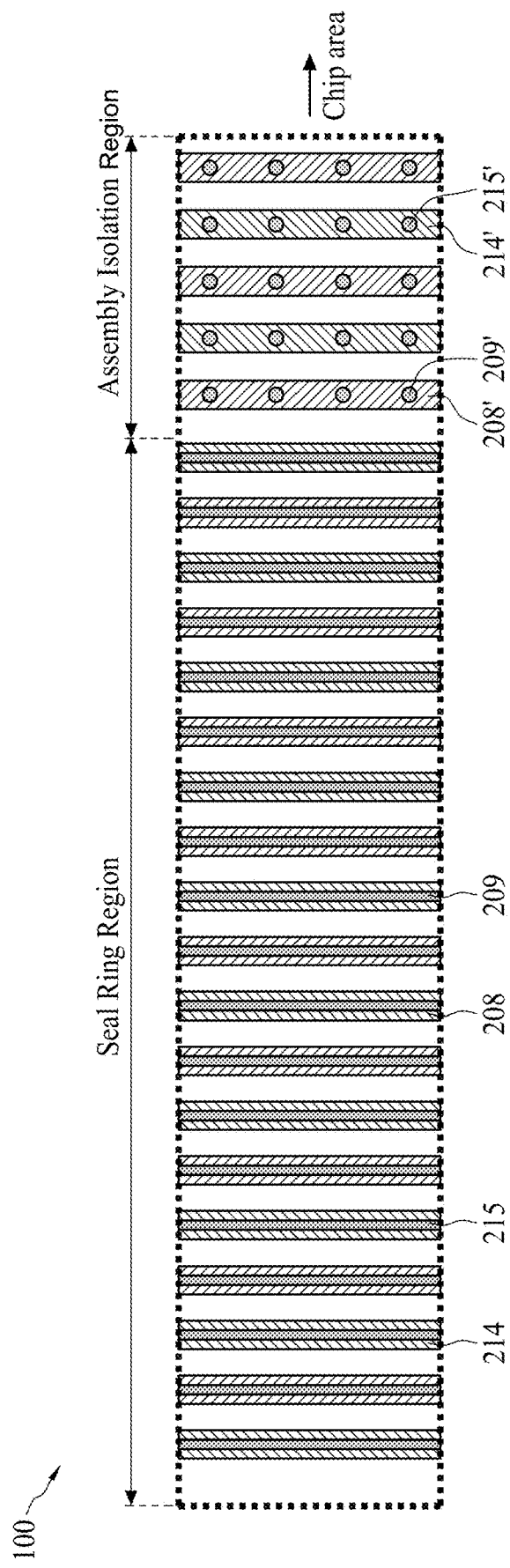

FIG. 9 illustrates a top plan view of the device 100 in the seal ring region and in the assembly isolation region, in portion, in the region "B" of FIG. 1 according to an alternative embodiment. The seal ring region (including the metal plugs 214, the dummy gates 208, and the vias 215 and 209) of this embodiment are configured similar to or substantially the same as the embodiment shown in FIG. 7. The assembly isolation region of this embodiment is configured differently than the embodiment shown in FIG. 7. In this embodiment, the dummy gates 208' and the metal plugs 214' are configured similar to or substantially the same as the dummy gates 208 and the metal plugs 214 (in terms widths, spacing, overall shape, and so on), respectively. Further, the device 100 in this embodiment includes round vias 209' disposed on the dummy gates 208' and round vias 215' disposed on the metal plugs 214'. Even though not shown, the vias 209' and 215' connect the dummy gates 208' and the metal plugs 214' to dummy vias and dummy metal lines in the connection structure 250' in the assembly isolation region.

Figure 10:
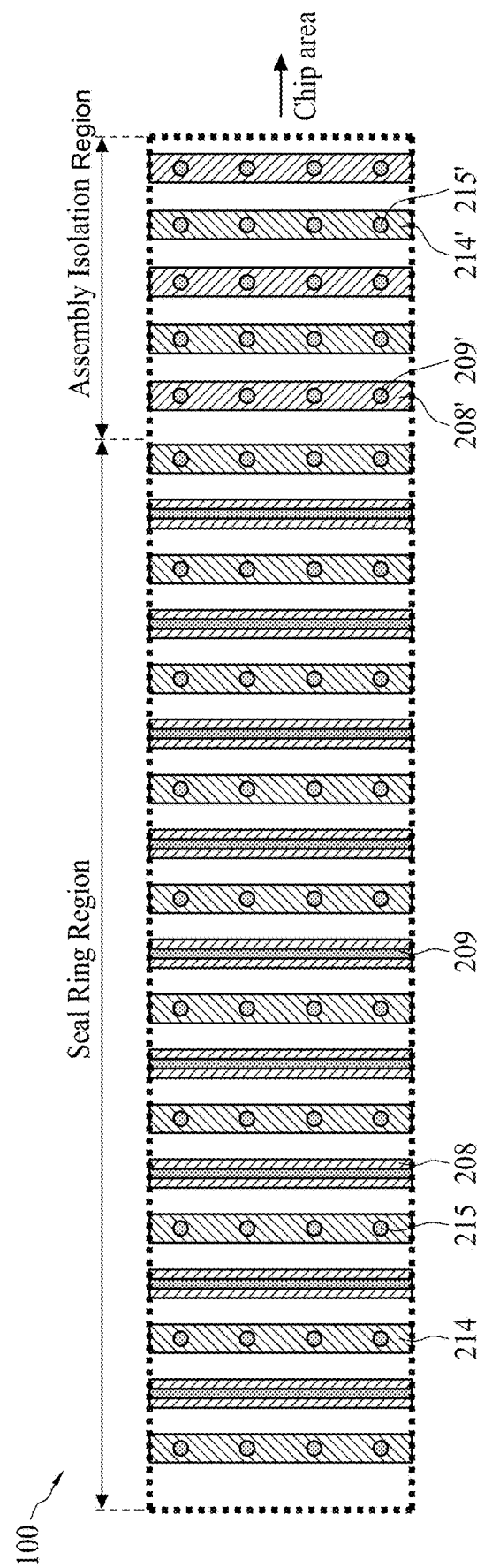

FIG. 10 illustrates a top plan view of the device 100 in the seal ring region and in the assembly isolation region, in portion, in the region "B" of FIG. 1 according to an alternative embodiment. The assembly isolation region (including the metal plugs 214', the dummy gates 208', and the vias 215' and 209') of this embodiment are configured similar to or substantially the same as the embodiment shown in FIG. 9. The dummy gates 208 and the metal plugs 214 in the seal ring region are also configured similar to or substantially the same as the embodiment shown in FIG. 9. Unlike the embodiments shown in FIG. 9, the vias 209 are formed into the same shape (from top view) as the dummy gates 208 (i.e., in the shape of a closed ring or a segmented ring), while the vias 215 are formed into round vias.

Figure 11:
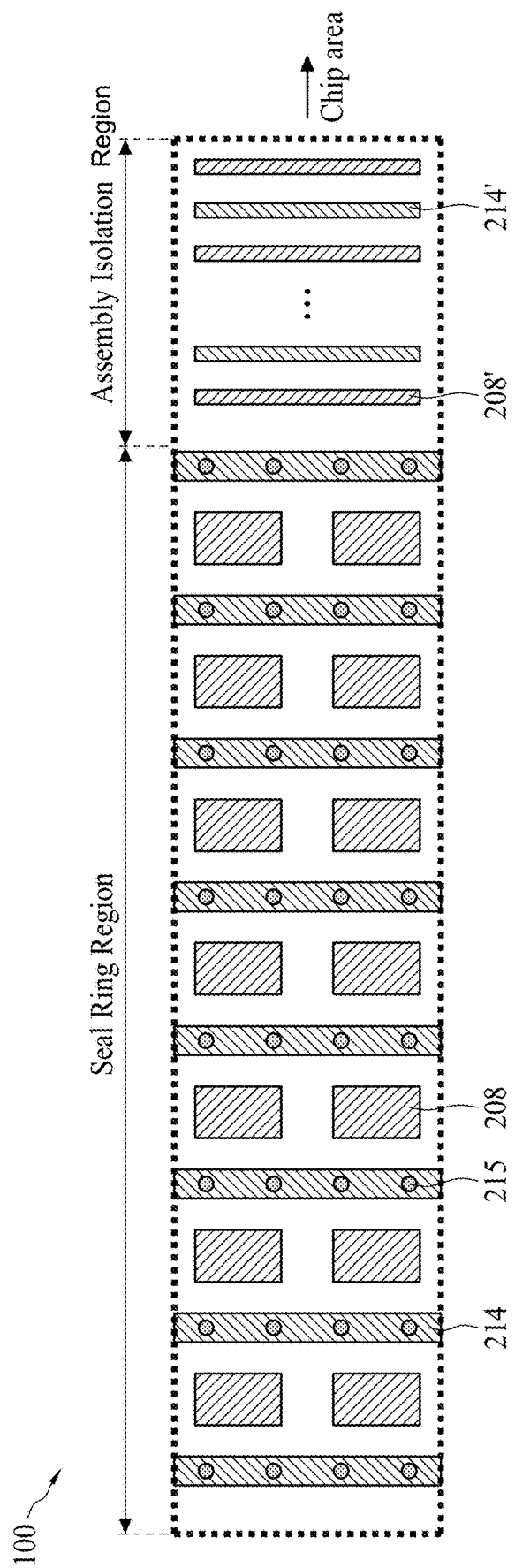

FIG. 11 illustrates a top plan view of the device 100 in the seal ring region and in the assembly isolation region, in portion, in the region "B" of FIG. 1 according to an alternative embodiment. The dummy gates 208, 208' and the metal plugs 214, 214' of this embodiment are configured similar to or substantially the same as the embodiment shown in FIG. 3. Unlike the embodiment shown in FIG. 3, the vias 215 of this embodiment are formed into round vias rather than a bar shape as in FIG. 3. In this embodiment, the device 100 does not include vias disposed over the dummy gates 208, 208' and the metal plugs 214'. The various embodiments shown in FIGS. 3, 7, 8, 9, 10, and 11 provide good pattern density and topography for forming the metal plugs 214 with good uniformity.

Figure 12:
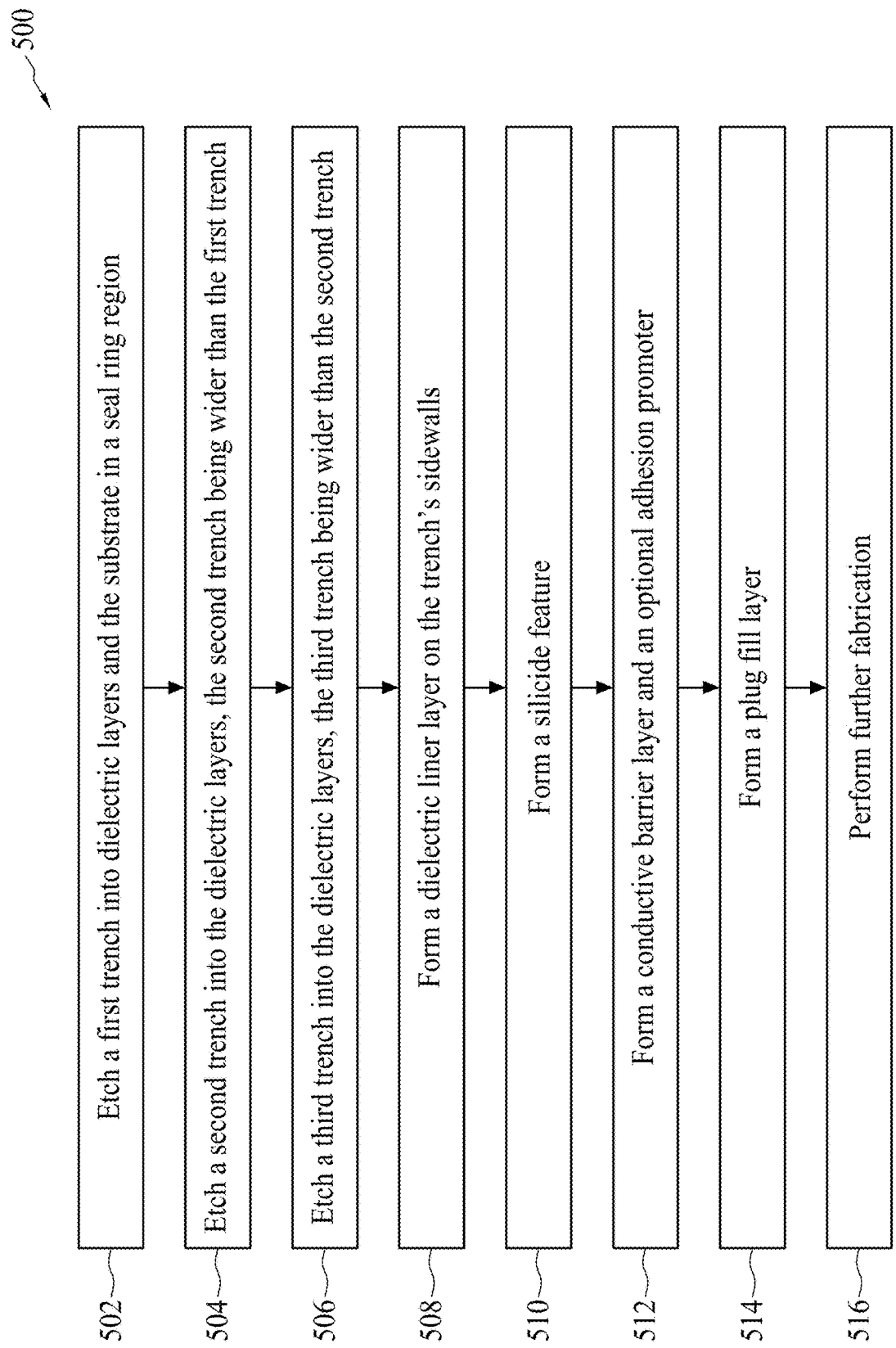
FIG. 12 illustrates a flow chart of a method for forming a semiconductor device with a seal ring, according to various aspects of the present disclosure.

FIG. 12 illustrates a flow chart of a method 500 for forming the metal plug 214, according to an embodiment of the present disclosure. Additional processing is contemplated by the present disclosure. Additional operations can be provided before, during, and after method 500, and some of the operations described can be moved, replaced, or eliminated for additional embodiments of method 500.

At operation 502, the method 500 (FIG. 12) etches a trench 313 into the interlayer 210 and the substrate 202, such as shown in FIG. 13. The trench 313 has a width w13 at the bottom section of the trench and has a depth d13. Operation 502 may use photolithography to form an etch mask over the interlayer 210 and then etch the interlayer 210 and the substrate 202 through the etch mask to form the trench 313. The photolithography may use EUV lithography, DUV lithography, immersion lithography, or other lithography. The etching may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The trench 313 may be formed into a closed ring such as the shape of the metal plug 214 in FIG. 4 or a segmented ring such as the shape of the metal plug 214 in FIG. 5. The operation 502 may form a plurality of trenches 313 in the seal ring region and the assembly isolation region.

At operation 504, the method 500 (FIG. 12) etches another trench 314 into the interlayer 210 and overlying the trench 313, such as shown in FIG. 14. The trench 314 has a width w14 at the bottom section of the trench and has a depth d14, wherein the width w14 is greater than the width w13 and the depth d14 is smaller than the depth d13. Operation 504 may use photolithography to form an etch mask over the interlayer 210 and then etch the interlayer 210 through the etch mask to form the trench 314. The photolithography may use EUV lithography, DUV lithography, immersion lithography, or other lithography. The etching may include dry etching, wet etching, reactive ion etching (RIE), and/or other suitable processes. In the present embodiment, etching of the trench 314 stops at the substrate 202.

Figures 15, 16:
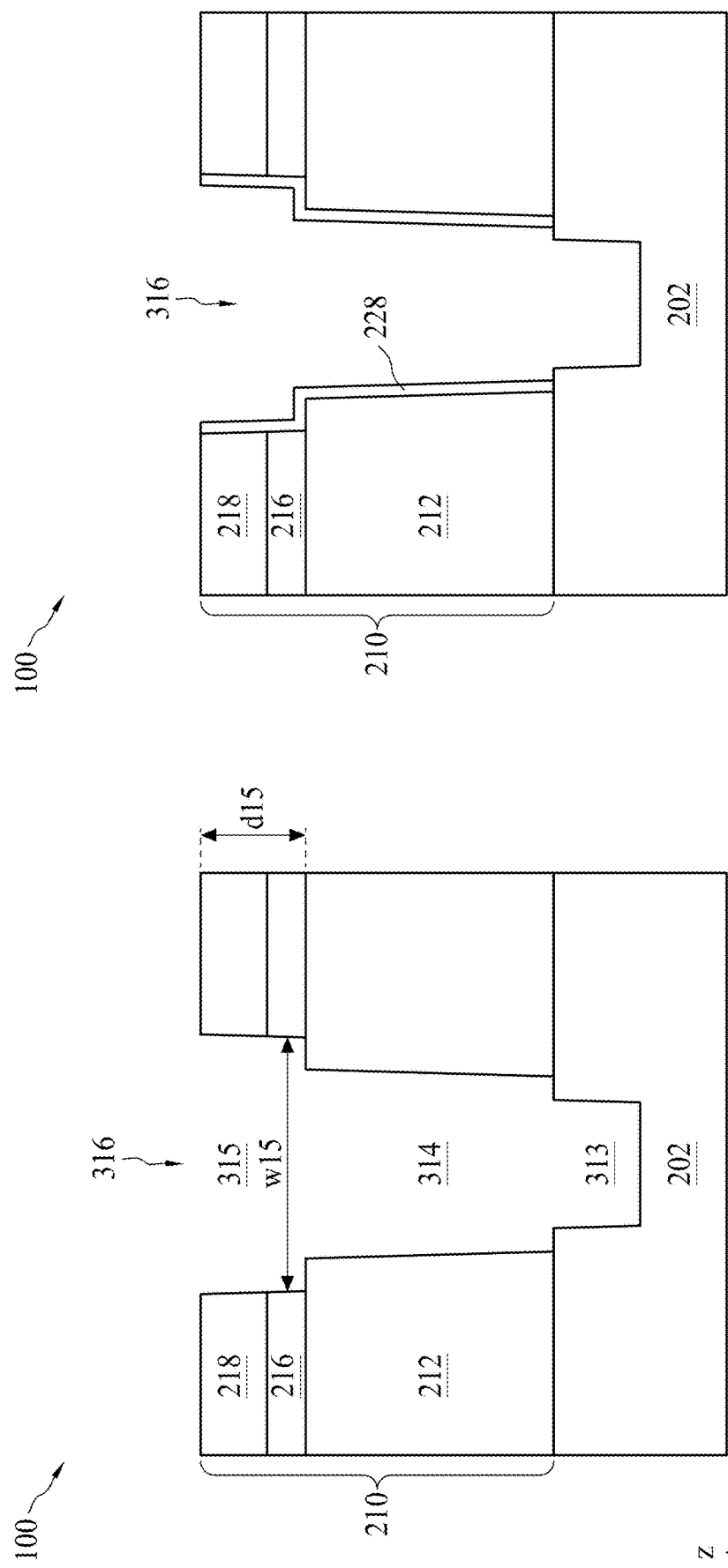

At operation 506, the method 500 (FIG. 12) etches another trench 315 into the interlayer 210 and overlying the trench 314, such as shown in FIG. 15. The trench 315 has a width w15 at the bottom section of the trench and has a depth d15, wherein the width w15 is greater than the width w14 and the depth d15 is smaller than the depth d14. Operation 506 may use photolithography to form an etch mask over the interlayer 210 and then etch the interlayer 210 through the etch mask to form the trench 315. In the present embodiment, etching of the trench 315 stops at the dielectric layer 212. The photolithography may use EUV lithography, DUV lithography, immersion lithography, or other lithography. The etching may include dry etching, wet etching, reactive ion etching (RIE), and/or other suitable processes. Through the operations 502, 504, and 506, a trench 316 (having three sections from trenches 313, 314, and 315) is formed into the substrate 202 and the interlayer 210. The trench 316 has a multi-step profile, with its width increasing step-wise along the "z" direction.

At operation 508, the method 500 (FIG. 12) forms a dielectric liner 228 over the sidewalls of the interlayer 210 in the trench 316, such as shown in FIG. 16. In an embodiment, the operation 508 may deposit a dielectric layer using atomic layer deposition (ALD) over the surfaces of the interlayer 210 and the substrate 202, and then etches the dielectric layer using anisotropic etching to remove it from the top surface of the interlayer 210 and the substrate 202. The portion of the dielectric layer remaining on the sidewalls of the interlayer 210 becomes the dielectric liner 228.

At operation 510, the method 500 (FIG. 12) forms the silicide feature 203, such as shown in FIG. 6. In an embodiment, the operation 510 includes depositing one or more metals into the trench 316, performing an annealing process to the device 100 to cause reaction between the one or more metals and the substrate 202 to produce the silicide features 203, and removing un-reacted portions of the one or more metals, leaving the silicide features 203 in the trench 316. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide features 203 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

At operation 512, the method 500 (FIG. 12) forms the conductive adhesion promoter 230 and the conductive barrier layer 232 in the trench 316, such as shown in FIG. 6. In an embodiment, each of the conductive adhesion promoter 230 and the conductive barrier layer 232 is deposited to have a substantially uniform thickness, and the remaining space of the trench 316 still has a multi-step profile. At operation 514, the method 500 (FIG. 12) deposits the metal core 234 into the remaining space of the trench 316. The conductive barrier layer 232 may include titanium (Ti), tantalum (Ta), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. In an embodiment, the conductive adhesion promoter 230 includes chromium, molybdenum, or other suitable material, and may be deposited using CVD, PVD, ALD, and/or other suitable processes. The metal core 234 may include tungsten (W), cobalt (Co), molybdenum (Mo), ruthenium (Ru), or other metals, and may be formed by CVD, PVD, ALD, plating, or other suitable processes. At operation 516, the method 500 (FIG. 12) performs further fabrications to the device 100. For example, the method 500 may perform a CMP process to remove excessive materials of the metal plugs 214, form the vias 215, form the dielectric layers 253, 255 and the connection structure 250.

Although not intended to be limiting, embodiments of the present disclosure provide one or more of the following advantages. For example, embodiments of the present disclosure provide various seal ring structures having a connection structure and one or more metal plugs connecting the connection structure to a substrate. The metal plug has a multi-step profile, which improves the filling of the metal plug and improves the adhesion between the metal plug and the substrate. This improves the ability of the seal ring to withstand stress during dicing. In embodiments, the seal ring structure further includes dummy gates that are alternately arranged with the metal plugs to substantially reduce or eliminate dishing in the seal ring region during chemical mechanical planarization (CMP) processing. In some embodiments, such metal plugs and dummy gates are also formed in an assembly isolation region, thereby balancing the topography loading during various processes, including CMP. Further, in some embodiments, multiple (such as four) seal rings are formed in the seal ring region to further improve the seal ring structure's operational reliability. Embodiments of the present disclosure can be readily integrated into existing semiconductor manufacturing processes.

In one example aspect, the present disclosure is directed to a semiconductor structure. The semiconductor structure includes a substrate having a seal ring region and a circuit region; one or more dielectric layers disposed on the substrate; a connection structure disposed in the one or more dielectric layers in the seal ring region, wherein the connection structure includes a stack of metal layers and metal vias connecting the stack of metal layers; and a metal plug disposed between the substrate and the connection structure in the seal ring region, wherein the metal plug has a multi-step profile in a cross-sectional view.

In an embodiment of the semiconductor structure, the metal plug includes a ring structure surrounding the circuit region from a top view. In another embodiment, the metal plug includes multiple segments that surround the circuit region from a top view.

In an embodiment, the semiconductor structure further includes a via bar disposed on the metal plug and connecting the metal plug to the connection structure. In another embodiment, the semiconductor structure further includes multiple vias disposed on the metal plug and connecting the metal plug to the connection structure.

In an embodiment, the semiconductor structure further includes a gate structure adjacent to the metal plug and disposed between the substrate and the connection structure in the seal ring region. In a further embodiment, the semiconductor structure includes a via bar disposed on the gate structure and connecting the gate structure to the connection structure.

In an embodiment of the semiconductor structure, the metal plug includes a conductive adhesion promoter in direct contact with a first dielectric layer on sidewalls of the metal plug, wherein a top portion of the metal plug extends higher than the conductive adhesion promoter.

In some embodiments, the semiconductor structure further includes a silicide layer between the substrate and the metal plug, wherein the metal plug is disposed on the silicide layer. In some embodiments where the substrate further includes an assembly isolation region between the seal ring region and the circuit region, the semiconductor structure further includes dummy vias disposed in the one or more dielectric layers in the assembly isolation region and a second metal plug disposed between the substrate and the dummy vias in the assembly isolation region. In a further embodiment, the second metal plug is isolated from the dummy vias.

In another example aspect, the present disclosure is directed to a semiconductor structure. The semiconductor structure includes a substrate having a seal ring region surrounding a circuit region; dielectric layers disposed on the substrate; and a connection structure disposed in the dielectric layers in the seal ring region, wherein the connection structure includes metal layers in a stacking configuration. The semiconductor structure further includes first metal plugs disposed between the substrate and the connection structure in the seal ring region, wherein each of the first metal plugs includes a cobalt core and a conductive barrier layer surrounding the cobalt core, wherein the cobalt core has at least two steps in a cross-sectional view. The semiconductor structure further includes first metal vias disposed on the first metal plugs and connecting the first metal plugs to the connection structure.

In an embodiment of the semiconductor structure, at least one of the first metal plugs includes a ring structure that surrounds the circuit region from a top view. In another embodiment, the semiconductor structure further includes first gate structures between the substrate and the connection structure in the seal ring region, wherein the first metal plugs and the first gate structures are disposed in an alternating manner. In a further embodiment where the substrate further has an assembly isolation region between the seal ring region and the circuit region, the semiconductor structure further includes second metal plugs and second gate structures over the substrate in the assembly isolation region. In yet another embodiment, at least one of the first metal vias is configured as a ring structure surrounding the circuit region.

In yet another example aspect, the present disclosure is directed to a semiconductor structure. The semiconductor structure includes a substrate having a first seal ring region and a second seal ring region surrounding a circuit region; dielectric layers disposed on the substrate; and multiple seal rings configured in each of the first and the second seal ring regions. Each of the seal rings includes a connection structure disposed in the dielectric layers and having a stack of interconnected metal layers; a metal plug disposed between the substrate and the connection structure, wherein the metal plug includes a metal core that has at least three sections and the three sections become wider as they are further away from the substrate; and a metal via disposed on the metal plug and connecting the metal plug to the connection structure.

In some embodiments, the metal plug includes a conductive adhesion promoter between the metal core and a first dielectric layer surrounding the metal plug, wherein a topmost section of the three sections is above the conductive adhesion promoter. In some embodiments, the metal core includes cobalt. In some embodiments, the metal plug is configured as a ring structure surrounding the circuit region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate having a seal ring region and a circuit region;
a dielectric interlayer over the substrate;
one or more dielectric layers disposed over the dielectric interlayer;
a connection structure disposed in the one or more dielectric layers in the seal ring region, wherein the connection structure includes a stack of metal layers and metal vias connecting the stack of metal layers; and
a metal plug disposed below the connection structure and disposed at least partially in the dielectric interlayer in the seal ring region, wherein a bottom surface of the metal plug is below a top surface of the substrate.

2. The semiconductor structure of claim 1, further comprising:
a dummy gate disposed at least partially in the dielectric interlayer in the seal ring region.

3. The semiconductor structure of claim 1, further comprising:
a via structure in the seal ring region and vertically connecting the metal plug to the connection structure.

4. The semiconductor structure of claim 1, wherein the metal plug has multiple sections of different widths in a cross-sectional view.

5. The semiconductor structure of claim 4, wherein a topmost section of the metal plug is wider than a bottommost section of the metal plug.

6. The semiconductor structure of claim 1, further comprising a silicide layer between the substrate and the metal plug.

7. The semiconductor structure of claim 6, wherein the metal plug includes an adhesion layer directly on the silicide layer, a conductive barrier layer on the adhesion layer, and metal fill layer on the conductive barrier layer.

8. The semiconductor structure of claim 1, wherein the substrate further includes an assembly isolation region between the seal ring region and the circuit region, further comprising:
another metal plug disposed at least partially in the dielectric interlayer in the assembly isolation region.

9. A semiconductor structure, comprising:
a substrate having a seal ring region and a circuit region;
a dielectric interlayer over the substrate;
one or more dielectric layers disposed over the dielectric interlayer;

a connection structure disposed in the one or more dielectric layers in the seal ring region, wherein the connection structure includes a stack of metal layers and metal vias vertically connecting the stack of metal layers; and multiple metal plugs disposed below the connection structure and disposed at least partially in the dielectric interlayer in the seal ring region, wherein each of the metal plugs has multiple sections of different widths in a cross-sectional view and a topmost section of the multiple sections is wider than a bottommost section of the multiple sections, and a bottom surface of each of the metal plugs is below a top surface of the substrate.

10. The semiconductor structure of claim 9, further comprising:

multiple dummy gates disposed at least partially in the dielectric interlayer in the seal ring region.

11. The semiconductor structure of claim 10, wherein each of the multiple metal plugs is formed as a continuous ring or a segmented ring, and the multiple dummy gates are formed as rectangular structures and are disposed between two of the multiple metal plugs.

12. The semiconductor structure of claim 11, wherein the multiple dummy gates are distributed substantially evenly along edges of the circuit region.

13. The semiconductor structure of claim 10, wherein the multiple metal plugs and the multiple dummy gates are arranged in an alternating manner along a lateral direction.

14. The semiconductor structure of claim 10, wherein each of the multiple metal plugs is formed into a continuous ring or a segmented ring, and each of the multiple dummy gates is formed into a continuous ring or a segmented ring.

15. The semiconductor structure of claim 9, wherein the substrate further includes an assembly isolation region between the seal ring region and the circuit region, further comprising:

one or more second metal plugs disposed in the assembly isolation region and partially extending into the substrate.

16. A method, comprising:

forming a dielectric interlayer over a substrate having a seal ring region and a circuit region;

forming a first trench into the dielectric interlayer and the substrate in the seal ring region;

forming a second trench into the dielectric interlayer directly above the first trench, wherein the second trench is wider than the first trench;

forming a conductive barrier layer in the first and the second trenches;

forming a metal core over the conductive barrier layer and in the first and the second trenches; and forming a connection structure directly over the metal core in the seal ring region, wherein the connection structure includes a stack of metal layers and metal vias vertically connecting the stack of metal layers.

17. The method of claim 16, further comprising:

forming a third trench into the dielectric interlayer directly above the second trench before the forming of the conductive barrier layer, wherein the third trench is wider than the second trench, wherein the conductive barrier layer and the metal core are also formed in the third trench.

18. The method of claim 16, further comprising:

forming a silicide layer on a portion of the substrate that is exposed by the first trench before the forming of the conductive barrier layer.

19. The method of claim 18, further comprising:

forming a dielectric liner layer on sidewalls of the first and the second trenches before the forming of the silicide layer.

20. The method of claim 19, further comprising:

forming an adhesion layer over the dielectric liner layer before the forming of the conductive barrier layer.

* * * * *